US009622353B2

(12) United States Patent
Balantrapu et al.

(10) Patent No.: US 9,622,353 B2
(45) Date of Patent: *Apr. 11, 2017

(54) IMAGING ON SUBSTRATES WITH ALKALINE STRIPPABLE UV BLOCKING COMPOSITIONS AND AQUEOUS SOLUBLE UV TRANSPARENT FILMS

(71) Applicant: Rohm and Haas Electronic Materials LLC, Marlborough, MA (US)

(72) Inventors: Krishna Balantrapu, Arlington, MA (US); Brian D. Amos, Worcester, MA (US); Stephen McCammon, Nashua, NH (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/853,364

(22) Filed: Sep. 14, 2015

(65) Prior Publication Data

US 2016/0353577 A1   Dec. 1, 2016

Related U.S. Application Data

(63) Continuation-in-part of application No. 14/726,602, filed on Jun. 1, 2015.

(60) Provisional application No. 62/006,056, filed on May 31, 2014.

(51) Int. Cl.
| | | |
|---|---|---|
| G03F 7/12 | (2006.01) |
| H05K 3/00 | (2006.01) |
| G03F 7/09 | (2006.01) |
| G03F 7/20 | (2006.01) |
| G03F 7/42 | (2006.01) |
| G03F 7/32 | (2006.01) |
| G03F 7/035 | (2006.01) |
| G03F 7/038 | (2006.01) |
| G03F 7/11 | (2006.01) |
| H05K 3/28 | (2006.01) |
| H05K 3/34 | (2006.01) |

(52) U.S. Cl.
CPC .......... *H05K 3/0079* (2013.01); *G03F 7/035* (2013.01); *G03F 7/038* (2013.01); *G03F 7/09* (2013.01); *G03F 7/091* (2013.01); *G03F 7/11* (2013.01); *G03F 7/20* (2013.01); *G03F 7/2018* (2013.01); *G03F 7/322* (2013.01); *G03F 7/425* (2013.01); *H05K 3/0076* (2013.01); *H05K 3/28* (2013.01); *H05K 3/0082* (2013.01); *H05K 3/3452* (2013.01); *H05K 2203/013* (2013.01); *H05K 2203/0551* (2013.01); *H05K 2203/0585* (2013.01)

(58) Field of Classification Search
USPC ........................................................ 430/319
See application file for complete search history.

(56) References Cited

U.S. PATENT DOCUMENTS

| | | | |
|---|---|---|---|
| 4,720,915 A | 1/1988 | Kennedy et al. |
| 5,624,483 A | 4/1997 | Fujioka |
| 6,132,500 A | 10/2000 | Inaishi |
| 6,399,281 B1 | 6/2002 | Cusdin et al. |
| 7,608,383 B2 | 10/2009 | Kim et al. |
| 8,003,299 B2 | 8/2011 | Takagi et al. |
| 8,303,832 B2 | 11/2012 | Torres et al. |
| 8,735,483 B2 | 5/2014 | Muro et al. |
| 2005/0164121 A1 | 7/2005 | Anzures |
| 2005/0165152 A1 | 7/2005 | Barr |
| 2006/0121389 A1 | 6/2006 | Anzures |
| 2006/0177771 A1* | 8/2006 | Takagi ............... G03F 1/56 430/300 |
| 2007/0028803 A1 | 2/2007 | Barr |
| 2008/0032209 A1* | 2/2008 | Imken ............... H05K 3/0082 430/5 |
| 2010/0029077 A1 | 2/2010 | Barr |
| 2011/0039194 A1 | 2/2011 | Torres et al. |
| 2011/0287634 A1 | 11/2011 | Barr |
| 2012/0070992 A1 | 3/2012 | Dong |
| 2012/0127443 A1 | 5/2012 | Ali et al. |
| 2014/0051248 A1 | 2/2014 | Dong |

OTHER PUBLICATIONS

EP15169451.0-1560, Corresponding EP Application, Search Report issued Oct. 23, 2015.
Office Action with Search report from corresponding Taiwan 104117131 application, dated Mar. 11, 2016.

* cited by examiner

*Primary Examiner* — Daborah Chacko Davis
(74) *Attorney, Agent, or Firm* — John J. Piskorski

(57) ABSTRACT

Substrates, such as printed circuit boards, are coated with an aqueous alkaline developable UV photosensitive material followed by applying an aqueous soluble UV transparent film to coat the UV photosensitive material. An aqueous alkaline strippable UV blocking composition is selectively applied to the surface of the UV transparent film to function as a mask. UV light is applied to portions of the UV photosensitive material not covered by the mask. The UV blocking composition, UV transparent film and selective sections of the UV photosensitive material are simultaneously removed with an aqueous alkaline developer solution to form an image on the substrate.

9 Claims, No Drawings

IMAGING ON SUBSTRATES WITH ALKALINE STRIPPABLE UV BLOCKING COMPOSITIONS AND AQUEOUS SOLUBLE UV TRANSPARENT FILMS The present application is a continuation-in-part application of U.S. application Ser. No. 14/726,602 filed Jun. 1, 2015.

FIELD OF THE INVENTION

The present invention is directed to selective imaging on substrates with alkaline strippable UV blocking compositions and aqueous soluble UV transparent films. More specifically, the present invention is directed to selective imaging on substrates with alkaline strippable UV blocking compositions and aqueous soluble UV transparent films to provide a more efficient and environmentally friendly method for the manufacture of electronic articles, such as printed circuit boards.

BACKGROUND OF THE INVENTION

One problem in the electronics industry is proper alignment or registration such as in the manufacture of printed circuit boards. Registration is the relative position of one or more printed circuit patterns or portions thereof with respect to desired locations on the printed circuit board of another pattern on the other side of the board.

One of the last steps in the manufacture of printed circuit boards is the application of solder mask to an outside layer. Liquid Photo Imagable Solder Mask (LPISM) is applied, tack dried to remove any solvents and selectively exposed using a phototool such that specific areas can be developed off the board. Such phototools, typically composed of diazo, silver halide, quartz or chrome, are prepared based on "idealized" dimensions of circuit line placement. However, variations in actual board dimensions or the circuit line from the "idealized" dimensions are common because of rigorous processing employed in the manufacture of the boards. Using an "idealized" phototool in combination with dynamically changing boards often results in registration problems particularly between boards in laminates. Because the solder mask step is one of the last steps in the manufacture of printed circuit boards, discarded boards caused by misregistration leads to costly and inefficient manufacturing processes. Misregistration creates failure of through-hole to line connection and shorts between through-holes and isolated conductors. Further, in conventional practice workers often prepare multiple fixed phototools and manually try to find the optimum fit between phototool and board to avoid misregistration. Such a process is both inaccurate and time consuming resulting in further inefficiency of multi-layer printed circuit board manufacture.

In an attempt to address the registration problem, a hybrid inkjet solder mask imaging method was developed. In this method, the solder mask is applied in a conventional manner: the printed circuit board is pre-cleaned and then coated with the solder mask and tack-dried. A vision system then captures fiducials on the board and aligns the board and the printed images with greater accuracy than is often achieved using conventional means. The inkjet printer then prints a UV blocking material on the board, thereby defining the pattern required for the solder mask. The board is exposed to the UV radiation with the inkjetted layer becoming a sacrificial mask. The board is then developed to produce a finished board with pads or openings, such as through-holes and vias.

However, the above process has its limitations. The solder mask is applied to a heavily textured surface with areas of raised through-holes, vias and metal tracks where select portions of the solder mask have to be developed off the board. Since many through-holes and vias in the printed circuit board have large surface areas, the solder mask covering the through-holes and vias does not always fill them up and planarize the surface. Inkjet printing UV block ink into the through-holes and vias wastes large amounts of ink and makes the process difficult and time consuming. In addition, once the through-holes and vias are filled with the UV block ink it is very difficult to remove the ink from the inside of the through-holes and vias. This causes a loss of continuity in the through-holes and vias thereby generating scrap boards. Accordingly, there is still a need for improved methods of forming images on substrates, such as printed circuit boards.

SUMMARY OF THE INVENTION

Methods include: providing a substrate comprising one or more apertures; applying an aqueous alkaline soluble UV photosensitive material adjacent a surface of the substrate including the one or more apertures; applying an aqueous soluble UV transparent film adjacent the aqueous alkaline soluble UV photosensitive material; selectively applying an aqueous alkaline strippable UV blocking composition adjacent the aqueous soluble UV transparent film; exposing the aqueous alkaline soluble UV photosensitive material to UV radiation except to regions covered with the aqueous alkaline strippable UV blocking composition; and simultaneously removing the aqueous alkaline strippable UV blocking composition, the aqueous soluble UV transparent film and selective portions of the aqueous alkaline soluble UV photosensitive material with an aqueous alkaline solution.

The methods are fast and economical. The UV blocking composition, UV transparent film and the UV photosensitive material may all be removed from the substrate simultaneously. No separate steps are required to remove each of the materials from the substrate. The methods are also environmentally friendly since the UV blocking composition, the UV transparent film and the UV photosensitive material may be removed from the substrate with aqueous alkaline solutions. Toxic and environmentally unfriendly organic solvents used in many conventional developers for imaging processes are avoided.

In many conventional imaging processes UV blocking compositions become lodged in apertures making removal very difficult and time consuming. Substantially complete removal of the UV blocking compositions is desired. The aqueous soluble UV transparent films prevent unwanted deposition of the UV blocking compositions in apertures as well as other areas of the substrate where the UV blocking compositions are unwanted. The methods may be used in the manufacture of electronic articles, such as printed circuit boards.

DETAILED DESCRIPTION OF THE INVENTION

As used throughout this specification, the following abbreviations have the following meanings, unless the context indicates otherwise: ° C.=degrees Centigrade; g=grams; L=liters; mL=milliliters; cm=centimeters; $\mu$=$\mu$m=microns;

cPs=centipoise; W=Watts=Amps×Volts; mJ=milliJoules; cPs=1 Pas (1 millipascal-second); DI=deionized; A=ampere; dm=decimeter; wt %=percent by weight; UV=ultraviolet; SEM=scanning electron microscope; and PCB=printed circuit board or printed wiring board.

"Aperture" means opening or hole. "Adjacent" means adjoining or contacting; "Feature" means apertures, components and circuitry on or within a substrate; "planarize" means a process which flattens the contours of a surface; "aqueous alkaline" means pH greater than 7; "aqueous soluble" means a material is soluble in a water based solution which may have an acidic, neutral or alkaline pH; "strippable" means that the material may be removed from a substrate but may not be substantially soluble in the stripping composition. "Fiducials" means objects placed in a field of view of an imaging system which appears in the image produced for use as a point of reference or measure. "refract" means to bend (light); The terms "a" and "an" refer to both the singular and the plural. All percentages are by weight, unless otherwise noted. All numerical ranges are inclusive and combinable in any order, except where it is logical that such numerical ranges are constrained to add up to 100%.

While the methods described are substantially directed to manufacturing a substrate such as a printed circuit board, it is envisioned that the methods as well as the alkaline strippable UV blocking compositions, aqueous soluble UV transparent films and aqueous alkaline UV photosensitive material may be used in the manufacture of various substrates where rapid and efficient imaging is desired, substantially all unwanted residues are removed and which include various features on their surfaces such that planarization of the surfaces may be challenging.

Printed circuit boards include a substrate such as a woven/laminated fiberglass material. An example of such a substrate is an FR4/glass-epoxy laminate. The substrate is rigid and may be drilled or machined. Such printed circuit boards include a patterned network of various features such as conductive electrical interconnections, for example, traces which may be raised or flush with the surface. Such traces are typically photolithographically patterned copper applied to the surface of the substrate. Such methods are well known in the art. In addition to the metal traces, the substrate includes a plurality of apertures such as through-holes and vias to allow for the interconnection of electronic circuits between laminates as in a multilayer printed circuit board. Some of the apertures may be raised or flush with the surface of the substrate. Such features provide a textured surface to the substrate. Typically the substrate is cleaned. Conventional cleaning formulations may be used. When the substrate is a printed circuit board, the cleaning solution may be a dilute aqueous acid solution such as 10% sulfuric acid. Optionally, the substrate is rinsed with flowing tap water.

An aqueous alkaline soluble UV photosensitive material, such as solder mask, is coated adjacent a surface of the substrate. The aqueous alkaline soluble UV photosensitive material may be applied to the substrate by screen coating or other conventional process. Preferably, the UV photosensitive material is a liquid solder mask and is soluble with aqueous based alkaline developers having a pH of greater than 7, preferably a pH of 7.5 to 12. A commercially available aqueous based alkaline soluble UV photosensitive material is PSR-4000-BN Green, manufactured by Taiyo. Examples of other liquid, aqueous alkaline soluble UV photosensitive materials are described in U.S. Pat. Nos. 5,952,154; 5,939,238; 5,939,239; and 6,329,123, the entire disclosures of which are hereby incorporated in their entirety by reference. The UV photosensitive material covers the surface of the entire substrate and at least partially fills the through-holes and vias on the surface of the substrate. Through-holes and vias may vary in size and surface area. Apertures, such as those with relatively large surface areas, are not typically completely filled with the UV photosensitive material. The partially filled apertures and raised traces provide an unplanarized or textured surface. The UV photosensitive material is tack cured or dried to drive off solvents and partially cure the UV photosensitive material. Tack curing typically involves drying the UV photosensitive material in a conventional oven. The aqueous alkaline soluble UV photosensitive material may be negative acting or positive acting. When the UV photosensitive material is negative acting, portions of the UV photosensitive material which are exposed to UV radiation during final curing remain on the substrate after application of the aqueous alkaline solution. When UV photosensitive material is positive acting, portions exposed to UV radiation are removed with aqueous alkaline solutions. Typically the photosensitive material is negative acting.

An aqueous soluble UV transparent film is then laminated adjacent the aqueous alkaline soluble UV photosensitive material to cover through-holes, vias and other surface features to planarize the surface. The film thickness may range from 5 μm and thicker. Preferably the films have a thickness range of 5 μm to 80 μm. Films thicker than 80 μm may refract light and cause light undercut. If the UV transparent films are too thick, they may refract or scatter the UV light such that sections of the UV photosensitive material covered with the alkaline strippable UV blocking composition may be undesirably exposed to the refracted or scattered light. Such aqueous soluble UV transparent films include, but are not limited to: aqueous soluble polymer materials such as polyvinyl alcohols (PVA), water soluble cellulose ethers, water soluble carboxyalkylcellulose ethers, water soluble salts of carboxyalkylcellulose, water soluble salts of carboxyalky starch, polyvinyl pyrrolidone, various polyacrylamides, water soluble polyamides, water soluble salts of polyacrylic acid, gelatin and ethylene oxide polymers. Preferably the aqueous soluble UV transparent films are polyvinyl alcohols. The films have flexibility and adhere to the tack dried aqueous alkaline soluble UV photosensitive material. An example of a commercially available aqueous soluble UV transparent film is LITHOBASE™ water soluble UV transparent polyvinyl alcohol film available from Dow Electronic Materials, Marlborough, Mass.

Preferably, a vision system is used to capture fiducials on the surface of the substrate and scales digital UV photosensitive material data. Such vision systems are well known in the art. An example of a vision system is LPKF ProtoMat™ H100 fiducial recognition camera by LPKF Laser & Electronics.

An aqueous alkaline strippable UV blocking composition is selectively applied to the UV transparent film to form either a negative or a positive of a desired pattern. Typically the UV blocking composition forms a negative of the desired pattern.

The alkaline strippable UV blocking compositions are substantially hot melt inks and are free of organic solvents as well as water. This means that no additional solvents or water are included in the compositions and only trace amounts of solvents or water may be present as impurities or as by-products in the manufacture of various components used to make the compositions. Preferably, the compositions are 100 wt % solids. They are low flowing, thus they form printed dots with aspect ratios (height to width) in the range of 0.05 to 0.25, preferably from 0.08 to 0.18. They also form images having good image definition.

The aqueous alkaline strippable UV blocking compositions include one or more rosin resins which are solid at room temperature. Rosin resins include fully hydrogenated or partially hydrogenated rosin acids or salts thereof which are derived from rosin acids of the abietic and pimaric types with a general formula $C_{19}H_{29}COOH$ with a phenanthrene nucleus. Isomers include, but are not limited to: levopimaric acid, neoabietic acid, palustric acid, dehydroabietic acid, dihydroabietic acid (3 probable) and tetrahydroabietic acid. The average weight molecular weight ranges from 300 to 308, preferably from 302 to 306. The acid number is at least 150, preferably from 155 to 190, more preferably from 160 to 180 mg KOH/g. Rosin is derived from pine trees (chiefly *Pinus palustris* and *Pinus elliotii*). Gum rosin is the residue obtained after distillation of turpentine oil from the oleoresin tapped from living trees. Wood rosin is obtained by extracting pine stumps with naphtha and distilling off the volatile fraction. Tall oil is co-product of the fractionation of tall oil. Hydrogenated rosin resins may be obtained commercially or extracted from their natural sources and refined according to methods disclosed in the literature. An example of a commercially available partially hydrogenated rosin resin is STAYBELITE® A hydrogenated rosin available from Pinova Incorporated. Another commercially available partially hydrogenated rosin resin is STAYBELITE® Resin-E available from Eastman Chemical Company. An example of a commercially available fully hydrogenated rosin is FORAL™ AX-E available from Eastman Chemical Company. Rosin resins may be included in the aqueous alkaline strippable UV blocking compositions in amounts of 15 wt % to 50 wt %, preferably from 20 wt % to 30 wt %.

The aqueous alkaline strippable UV blocking compositions also include one or more fatty acids or salts thereof having a formula R—COO-M where R is a linear, branched or cyclic alkyl or alkenyl group having 7 to 48 carbon atoms, preferably 12 to 24 carbon atoms and M is hydrogen or a counterion such as sodium, potassium, calcium ammonium or $NH_y(CH_2CH_2OH)_z$ where y and z are integers from 0 to 4 and their sum is always 4. Such fatty acids include, but are not limited to: caprylic acid, capric acid, lauric acid, linoleic acid, myristic acid, oleic acid, palmitic acid and stearic acid or salts thereof. Preferably, the fatty acids are chosen from lauric acid, linoleic acid, myristic acid, palmitic acid, stearic acid and salts thereof. More preferably the fatty acids are chosen from myristic acid, palmitic acid, stearic acid and salts thereof. Such fatty acids and salts thereof have acid numbers of 190 and greater, preferably, from 195 to 250 mg KOH/g. Many of the fatty acids or salts thereof may be derived from natural oils, such as marine, rapeseed, tallow, tall oil, soy, cottonseed and coconut. Such fatty acids, salts and mixtures are either commercially available or may be manufactured by techniques known in the art. The fatty acids may be included in amounts of 40 wt % to 80 wt %, preferably from 55 wt % to 65 wt %.

The aqueous alkaline strippable UV blocking compositions may have a net acid number of 160 KOH/g and greater. Preferably, the UV blocking compositions have a net acid number of 200 KOH/g to 220 KOH/g.

One or more UV absorbing agents are included in the UV blocking composition. They are included in the UV blocking compositions in sufficient amounts to block UV light from contacting the underlying film and UV photosensitive material. Preferably the UV absorbing agents are included in amounts of 0.05 wt % to 10 wt %, more preferably from 1 w t% to 5 wt % of the UV blocking composition. Such UV absorbing agents include, but are not limited to: benzophenone, benzophenone derivatives, benzotriazoles and benzotriazole derivatives. Such benzophenone derivatives include, but are not limited to: 4-(dinethylamino) benzophenone; 4,4'-bis(dimethylamino) benzophenone; 4,4'-bis(diethylamino) benzophenone; 4,4'-(methyl-ethylamino)benzophenone; 2,2'-(dihydroxy-4-methoxy) benzophenone and 4,4'-bis(diphenoxy) benzophenone. Triazines such as s-triazines, benzoates such as octyl-p-dimethylaminobenzoate, cinnamates such as octylmethoxycinnamate, salicylates such as octylsalicylate, crylenes such as octocrylene, cyanoacrylates such as 2-ethylhexyl 2-cyano-3,3-diphenylacrylate, malonates, oxanilides, 2-cyanoacrylates, and formamidines. Examples of benzotriazoles and benzotriazole derivatives include but not limited to 2-(2-hydroxy-5-tert-octylphenyl) benzotriazole 2-(3'-tert-butyl-2'-hydroxy-5'-methylphenyl)-5-Chlorobenzotriazole, 2-(2'-hydroxy-3',5'-di-t-butylphenyl)-5-chlorobenzotriazole, 2-(2'-hydroxy-5'-methylphenyl) benzotriazole, 2-(2'-hydroxy-3',5'-di-t-amylphenyl) benzotriazole, 2-(2'-hydroxy-3'-t-butyl-5'-methylphenyl)-5-chlorobenzotriazole, 2-(2H-benzotriazol-2-yl)-4-(1,1,3,3,-tetramethylbutyl)phenol Additional UV blocking agents include, but are not limited to: anthraquinone, substituted anthraquinones such as alkyl and halogen substituted anthraquinones such as 2-tertiary butyl anthraquinone, 1-chloroanthraquinone, p-chloroanthraquinone, 2-methylanthraquinone, 2-ethylanthraquinone, octamethyl anthraquinone and 2-amylanthraquinone, optionally substituted polynuclear quinones such as 1,4-naphthaquinone, 9,10-phenanthraquinone, 1,2-benzanthraquinone, 2,3-benzanthraquinone, 2-methyl-1,4-napththoquinone, 2,3-dichloronaphthaquinone, 1,4-dimethylanthraquinone, 2,3-dimethylanthraquinone, 2-phenylanthraquinone, 2,3-diphenylanthraquinone, 3-chloro-2-methylanthraquinone, retenequinone, 7,8,9,10-tetrahydronaphthaanthraquinone, 1,2,3,4-tetrahydrobenzanthracene-7,2-dione, acetophenones such as acetaphenone, 2,2-dimethoxy-2-phenyl acetophenone, 2,2-diethoxy-2-phenyl acetophenone, 1,1-dichloro acetophenone, 1-hydroxy cyclohexyl phenylketone and 2-methyl-1-(4-methylthio) phenyl-2-morpholin-propan-1-one; thioxanthones such as 2-methylthioxanthone, 2-decylthioxanthone, 2-dodecylthioxanthone, 2-isopropylthioxanthone, 2,4-dimethylthioxanthone, 2,4-diethylthioxanthone, 2-chlorothioxanthone and 2,4-diisopropylthioxanthone; ketals such as acetophenone dimethylketal and dibenzylketal; benzoins and benzoin alkyl ethers such as benzoin, benzylbenzoin methyl ether, benzoin isopropyl ether and benzoin isobutyl ether; azo compounds such as azobisisovaleronitrile; Michler's Ketone, Ethyl Michler's Ketone and xanthone, and mixtures thereof.

Organic pigments may be used as UV absorbing agents. Such organic pigments include, but are not limited to: carbon black, indigo, phthalocyanine, para red, flavanoids such as red, yellow, blue, orange and ivory colors may be used as UV blocking agents. Examples of pigments having color index (C.I.) numbers include C.I. Pigment Yellow 12, C.I. Pigment Yellow 13, C.I. Pigment yellow 14, C.I. Pigment Yellow 17, C.I. Pigment Yellow 20, C.I. Pigment Yellow 24, C.I. Pigment Yellow 31, C.I. Pigment Yellow 55, C.I. Pigment Yellow 83, C.I. Pigment Yellow 93, C.I. Pigment yellow 109, C.I. Pigment Yellow 110, C.I. Pigment Yellow 139, C.I. Pigment Yellow 153, C.I. Pigment Yellow 154, C.I. Pigment Yellow 166, C.I. Pigment Yellow 168, C.I. Pigment Orange 36, C.I. Pigment Orange 43, C.I. Pigment Orange 51, C.I. Pigment Red 9, C.I. Pigment Red 97, C.I. Pigment Red 122, C.I. Pigment Red 123, C.I. Pigment Red 149, C.I. Pigment Red 176, C.I. Pigment Red 177, C.I.

Pigment Red 180, C.I. Pigment Red 215, C.I. Pigment Violet 19, C.I. Pigment Violet 23, C.I. Pigment Violet 29, C.I. Pigment Blue 15, C.I. Pigment Blue 15:3, C.I. Pigment Blue 15:6, C.I. Pigment Green 7, C.I. Pigment Green 36, C.I. Pigment Brown 23, C.I. Pigment Brown 25, C.I. Pigment Black 1 and C.I. Pigment Black 7. Other suitable pigments include, but are not limited to: titanium dioxide, Prussian blue, cadmium sulfide, iron oxides, vermillion, ultramarine and the chrome pigments, including chromates, molybdates and mixed chromates and sulfates of lead, zinc, barium, calcium and mixtures and modifications thereof which are commercially available as greenish-yellow to red pigments under the names primrose, lemon, middle orange, scarlet and red chromes.

Organic dyes also may be used in the UV blocking compositions as UV absorbing agents. Such dyes include but are not limited to: azo dyes, anthraquinone, benzodifuranone, indigold, polymethine and related dyes, styryl, di- and triaryl carbonium dyes and related dyes, quinophthalones, sulfurbased dyes, nitro and nitroso dyes, stilbenes, formazans, dioxazines, perylenes, quinacridones, pyrrolo-pyrroles, isoindolines and isoindolinones. Other suitable dyes include, but are not limited to: azo dyes, metal complex dyes, Naphthol dyes, indigo dyes, carbonium dyes, quinoneimine dyes, xanthene dyes, cyanine dyes, quinoline dyes, nitro dyes, nitroso dyes, benzoquinone dyes, naphthoquinone dyes, penoline dyes, pthalicyanine dyes, leuco dyes and fluorescent dyes. Examples of fluorescent dyes are xanthenes such as rhodamine and fluorescein, bimanes, coumarins such as umbelliferone, aromatic amines such as dansyl, squarate dyes, benzofurans, cyanines, merocyanines, rare earth chelates and carbozoles.

Commercially available UV absorbing agents include, but are not limited to: CYASORB™ UV 24 available from Spectrum laboratories Inc., LOWILITE™ 27, LOWILITE™ 22, LOWILITE™ 55, LOWILITE™ 26 available from Addivant LLC, BLS 531, BLS 5411, BLS 1326 available from Mayzo, Inc., Speedcure™ ITX, EHA and 3040, Irgacure™ 184, 369, 907 and 1850, Daracure™ 1173. Speedcure™, Irgacure™ and Daracure™ are registered trademarks of Lambson Plc and Ciba GmbH, respectively.

Additional optional additives include, but are not limited to: surfactants such as non-ionic, cationic, anionic and amphoteric, slip modifiers, thixotropic agents, anti-foaming agents, plasticizers, thickeners, antioxidants, fungicides, bactericides and antistatic agents. Such optional additives may be included in conventional amounts which are well known in the art and described in the literature.

The UV blocking compositions may be prepared by any suitable method known in the art. The rosin resins and fatty acids are typically solids or semi-solids at room temperature. They may be combined together in any order. They may be heated to soften or liquefy them such that they may be readily mixed together along with any additional components. Components may be combined in any order in a conventional mixing or homogenizing apparatus. Temperatures from room temperature to 150° C. typically are employed to mix the components. After the components are uniformly mixed the mixture may be cooled to room temperature or below to form a solid hot melt composition.

Typically, viscosities of the UV blocking compositions range from 4 cPs to 80 cPs from 40° C. to 150° C. Preferably the viscosities range from 8 cPs to 12 cPs from 85° C. to 95° C. Viscosity may be measured by conventional methods but is typically measured using a Brookfield viscometer with a rotating spindle, for example a number 18 spindle or a CP-42 spindle.

The aqueous alkaline strippable UV blocking compositions are selectively applied to the UV transparent film to form a pattern on the film. In addition to planarizing the surface, the film prevents the UV blocking compositions from entering any of the apertures on the substrate which are not completely filled with the UV photosensitive material. While it is envisioned that the aqueous alkaline strippable UV blocking compositions may be selectively applied by various methods known in the art, such as, but not limited to: screen printing and inkjet, preferably inkjet is used to selectively apply the UV blocking compositions adjacent to the UV transparent films.

Inkjet apparatus may digitally store information in its memory for a selective UV blocking pattern to be applied to a substrate. Examples of suitable computer programs are standard CAD (computer aided design) programs for generation of tooling data. Workers may readily modify the selective deposition of the UV blocking compositions by changing the program digitally stored in the ink jet apparatus. Additionally, registration problems also may be readily addressed. The inkjet apparatus may be programmed to perceive potential incorrect alignment between substrates, such as in the manufacture of multi-layer printed circuit boards. When the apparatus senses misregistration between boards, the program modifies the inkjet application of the UV blocking composition pattern to avoid or correct misregistration between adjacent boards. The ability to re-design the pattern from board to board reduces the potential for misregistration between the boards, and eliminates the costly and inefficient task of preparing multiple fixed phototools.

There are two major categories of inkjet printing, "Drop-On-Demand" inkjet and "Continuous" inkjet. Using Drop-On-Demand inkjet technology the aqueous alkaline soluble UV blocking composition is stored in a reservoir and delivered to a nozzle in the print head of the printer. A means exists to force a single drop of the composition out of the nozzle and onto a substrate. Typically this is a piezo electric actuation of a diaphragm within a chamber, which "pumps" the droplets out of the nozzles, or a localized heating of the fluid to increase the pressure within the chamber, thus forcing a droplet to eject.

In "continuous" inkjet printing, a continuous stream of the aqueous alkaline soluble UV blocking composition is delivered to a nozzle in the print head of the printer. Prior to passing out of the nozzle, the pressurized composition stream proceeds through a ceramic crystal subjected to an electric current. This current causes a piezoelectric vibration equal to the frequency of AC (alternating current) electric current. This vibration, in turn, generates droplets of the composition from the unbroken stream. The composition breaks up into a continuous series of drops, which are equally spaced and of equal size. Surrounding the jet at the point where the drops separate from the liquid stream in a charge electrode a voltage is applied between the charge electrode and the drop stream. When the drops break off from the stream, each drop carries a charge proportional to the applied voltage at the instant at which it breaks off. By varying the charge electrode voltages at the same rate as drops are produced every drop may be charged to a predetermined level. The drop stream continues its flight and passes between two deflector plates, which are maintained at a constant potential such as +/−0.1 kV to +/−5 kV, or such as +/−1 kV to +/−3 kV. In the presence of this field, a drop is deflected towards one of the plates by an amount proportional to the charge carried. Drops, which are uncharged, are undeflected and collected into a gutter to be recycled to the ink nozzle. Drops which are charged and hence deflected impinge on a radiant energy sensitive material traveling at right angles to the direction of drop deflection. By varying the charge on individual drops, a desired pattern can be applied. Drop sizes may range from 30 μm to 100 μm, or such as from 40 μm to 80 μm, or such as from 50 μm to 70 μm in diameter.

The inkjet processes are adaptable to computer control for high-speed application of continuously variable data. Inkjet printing methods may be divided into three general categories: high pressure (10 psi and greater), low pressure (less than 10 psi) and vacuum techniques. All are known in the art or described in the literature and can be employed in the application of the aqueous alkaline soluble UV blocking compositions to aqueous alkaline soluble UV transparent films.

After completion of selective application of the aqueous alkaline strippable UV blocking composition to the aqueous soluble UV transparent film, UV radiation is applied to the article including the substrate, partially cured aqueous alkaline soluble UV photosensitive material, aqueous soluble UV transparent film and the aqueous alkaline strippable UV blocking composition. Portions of the partially cured UV photosensitive material not covered by the UV blocking composition are exposed to the UV radiation and substantially completely cure. Conventional sources of UV radiation may be used, such as a Fusion D lamp running at 120 W/cm UV radiation may vary from 100-1000 mJ/cm$^2$.

The substrate is then immersed in or sprayed with an aqueous alkaline solution to simultaneously remove the aqueous alkaline strippable UV blocking composition, UV transparent film and uncured portions of the UV photosensitive material. The removing or developing step may be done at room temperature to 60° C. The developing step substantially removes all of the aqueous alkaline soluble and strippable materials as well as the aqueous soluble film. Features and apertures are clear of any residue from the partially cured UV photosensitive material. A patterned cured mask, such as a solder mask, remains on the substrate.

Aqueous alkaline solutions used to remove the aqueous alkaline soluble and strippable materials and aqueous soluble films from the substrate have a pH greater than 7. Preferably the pH range is 7.5 to 12. Such aqueous alkaline solutions may include alkali metal hydroxides, such as potassium hydroxide, sodium hydroxide and mixtures thereof, or alkali carbonates, bicarbonates and mixtures thereof. Such aqueous alkaline solutions typically include 1 wt % to 5 wt % of the alkaline compounds.

The following example is intended to further illustrate the invention but is not intended to limit its scope.

EXAMPLE

One copper clad FR4/glass epoxy panel 46 cm×61 cm×0.25 cm is run through an acid copper pre-clean line for 2 minutes. The panel includes a plurality of through-holes and vias. The cleaning solution is an aqueous solution of 10% sulfuric acid. Cleaning is done at temperatures of 40-50° C. The panel is then rinsed with running tap water for 60 seconds and then plated with a layer of copper 0.002 cm thick using COPPER GLEAM™ HS-200 Electrolytic Copper bath (available from Dow Electronic Materials, Marlborough, Mass.) in a conventional plating cell and using an insoluble anode. Electroplating is done at a current density of 0.5 A/dm$^2$ at 30°-35° C. The panel is then processed through a horizontal acid cleaner for 2 minutes at 40°-50° C. The acid cleaner is an aqueous solution of 10% sulfuric acid. The panel is rinsed with flowing tap water for 60 seconds and air dried.

A flood coat of PSR-4000-BN Green liquid photo-imageable solder mask manufactured by Taiyo is applied to both sides of the panel using a DP-1500 applicator coating the panel and at least partially filling the through-holes and vias. The liquid solder mask is tack dried on the panel in a conventional convection oven.

LITHOBASE™ water soluble UV transparent polyvinyl alcohol film is then laminated on the tack dried solder mask at room temperature covering the through-holes and vias as well as any other features on the panels. The panels are sheared to yield eight 15 cm×23 cm test coupons. The film on each coupon is gently pressed and squeegeed to remove any air underneath the film. Each coupon is then inspected for any wrinkles or creases in the UV transparent polyvinyl alcohol film and further squeegeed if needed.

Each coupon is then selectively ink jetted with a UV blocking hot melt ink as shown in the table below from a piezoelectric drop-on-demand print head (Spectra™ SE-128) onto the UV transparent polyvinyl alcohol film. Ink jetting temperature is from 90°-95° C.

| COMPONENT | AMOUNT |
| --- | --- |
| Staybelite ® A Hydrogenated Rosin[1] | 29.25 wt % |
| Stearic acid[2] | 58.75 wt % |
| Irgacure 184[3] | 2 wt % |
| Cyasorb UV 24[4] | 5 wt % |
| EMK[5] | 5 wt % |

[1]a gum rosin that has been partially hydrogenated via a catalytic process: CAS No. 65997-06-0, available from PINOVA ®. A typical composition: abietic acid <3 wt %, dehydroabietic acid 6-10 wt %, dihydroabietic acid 60-80 wt %, tetrahydroabietic acid 5-15 wt %, other resin acids and neutrals 10-15 wt %.
[2]fatty acid: CAS No. 57-11-4.
[3]1-hydroxycyclohexyl phenyl ketone: CAS No. 947-19-3.
[4]dioxybenzone: CAS No. 131-53-3.
[5]4,4'-bis(diethylamino)benzophenone: CAS No. 90-93-7.

The hot melt ink dries on the surface of the UV transparent polyvinyl alcohol film and then the coupons are passed underneath UV radiation of 240-250 mJ/cm$^2$ using a Fusion D lamp running at 120 W/cm. The UV radiation cures the tack dry solder mask in regions which are not covered by the UV blocking hot melt ink. Each coupon is then immersed in an aqueous developer solution of 1 wt % sodium carbonate with a pH greater than 7 at a temperature of 50° C. for one minute. The coupons are removed from the developer solution and rinsed with DI water for one minute and allowed to air dry. Each coupon is then examined for any residue of the hot melt ink, polyvinyl alcohol film and uncured solder mask using a conventional SEM. All uncured solder mask as well as the hot melt ink and polyvinyl alcohol film appear substantially removed from each coupon. All features including through-holes and vias appear substantially free of any uncured solder mask, hot melt ink and polyvinyl alcohol film.

What is claimed is:
1. A method comprising:
a. providing a substrate comprising raised traces, and one or more apertures selected from the group consisting of through-holes and vias;
b. applying an aqueous alkaline soluble UV photosensitive material adjacent a surface of the substrate comprising the one or more apertures and the raised traces to provide an unplanarized surface on the aqueous alkaline soluble UV photosensitive material;

c. applying a flexible aqueous soluble UV transparent film adjacent the aqueous alkaline soluble UV photosensitive material with the unplanarized surface to planarize the surface, wherein the flexible aqueous soluble UV transparent film is selected from the group consisting of aqueous soluble polyvinyl alcohols, water soluble cellulose ethers, water soluble carboxyalkylcellulose ethers, water soluble salts of carboxyalkylcellulose, water soluble salts of carboxyalkyl starch, water soluble polyvinyl pyrrolidone, water soluble polyacrylamides, water soluble salts of polyacrylic acid, gelatin and ethylene oxide polymers;

d. selectively applying an aqueous alkaline strippable UV blocking composition adjacent the flexible aqueous soluble UV transparent film;

e. exposing the aqueous alkaline soluble UV photosensitive material with the planarized surface to UV radiation except in regions covered with the aqueous alkaline strippable UV blocking composition; and f. simultaneously removing the aqueous alkaline strippable UV blocking composition, the flexible aqueous soluble UV transparent film and selective portions of the aqueous alkaline soluble UV photosensitive material with the planarized surface with an aqueous alkaline solution.

2. The method of claim 1, further comprising providing a vision system to capture fiducials on a surface of the substrate and scale digital aqueous alkaline soluble UV photosensitive material data.

3. The method of claim 1, wherein the aqueous alkaline strippable UV blocking composition comprises one or more rosin resins, one or more fatty acids and one or more UV blocking agents.

4. The method of claim 3, wherein the one or more UV blocking agents comprise benzophenone, benzophenone derivatives, benzotriazoles, benzotriazole derivatives, triazines, cinnamates, salicylates, crylenes, cyanoacrylates, malonates, oxanilides, formamides, anthraquinones, substituted anthraquinones, organic dyes and organic pigments.

5. The method of claim 3, wherein the one or more rosin resins comprise fully hydrogenated and partially hydrogenated rosin resins.

6. The method of claim 3, wherein the one or more fatty acids comprise caprylic acid, capric acid, lauric acid, linoleic acid, myristic acid, oleic acid, palmitic acid and stearic acid and salts thereof.

7. The method of claim 3, wherein the one or more rosin resins are in amounts of 15% to 50% of the aqueous alkaline UV blocking composition.

8. The method of claim 3, wherein the aqueous alkaline strippable UV blocking composition further comprises one or more of colorants.

9. The method of claim 1, wherein the substrate is a printed circuit board.

* * * * *